United States Patent [11] 3,621,277

United States Patent

[11] 3,621,277

[72] Inventor Ciro A. Cancro
Silver Spring, Md.
[21] Appl. No. 889,423
[22] Filed Dec. 31, 1969
[45] Patented Nov. 16, 1971
[73] Assignee The United States of America as represented by the Administrator of the National Aeronautics and Space Administration

[54] FAST RESPONSE LOW-POWER-DRAIN LOGIC CIRCUITS
10 Claims, 2 Drawing Figs.

[52] U.S. Cl. .......... 307/206, 307/215, 307/322, 307/323
[51] Int. Cl. .......... H03k 19/08
[50] Field of Search .......... 307/322, 206, 290, 215, 323

[56] References Cited

UNITED STATES PATENTS

| | | | |
|---|---|---|---|
| 3,054,911 | 9/1962 | Buelow | 307/215 |
| 3,218,466 | 11/1965 | Walsh et al. | 307/206 |
| 3,248,563 | 4/1966 | Lin | 307/206 |
| 3,510,679 | 5/1970 | Peil | 307/322 |

OTHER REFERENCES

" Logic Circuit" by Henle et al., IBM Technical Disclosure Bulletin, Vol. 7, No. 11, Apr. 1965

*Primary Examiner*—Donald D. Forrer
*Assistant Examiner*—Harold A. Dixon
*Attorneys*—R. F. Kempf, E. Levy, G. T. McCoy and G. M. Fisher

ABSTRACT: This disclosure describes switching circuits, useful as basic logic circuits, that comprise tunnel diodes in combination with transistors. The use of tunnel diodes, constant-current switching and series feedback between transistors, results in switching circuits with very fast response times and low-power drains.

INVENTOR
CIRO A. CANCRO
BY
ATTORNEYS

FAST RESPONSE LOW-POWER-DRAIN LOGIC CIRCUITS

ORIGIN OF THE INVENTION

The invention described herein was made by an employee of the United States Government and may be manufactured and used by or for the Government for governmental purposes without the payment of any royalties thereon or therefor.

BACKGROUND OF THE INVENTION

This invention is directed to switching or basic logic circuits and more particularly to transistorized logic circuits that include tunnel diodes.

Prior art transistorized switching logic circuits, particularly AND and NAND gates, make use of various combinations of transistors, diodes, resistors and capacitors to form the required logic functions. While some of these circuits have been extensively used, in general, they all have common disadvantages. Specifically, prior art transistorized logic circuits designed to have a very fast response time also have a very high power drain. Alternatively, prior art transistorized logic circuits designed to have a low-power drain also have a relatively low response time. However, in some environments, such as on board a space vehicle, it is desirable to have logic or switching circuits that have both a rapid response time and a low-power drain.

Therefore, it is an object of this invention to provide new and improved basic switching or logic circuits.

It is a further object of this invention to provide new and improved basic transistorized logic circuits that have both a rapid response time and a low-power drain.

It will be appreciated that many prior art transistorized logic and switching circuits also have other disadvantages. For example, many of them possess a relatively high output impedance, whereby the output of the system is easily loaded. In addition, many of them have a relatively low input impedance thus allowing them to load other circuits feeding them signals. Moreover, many prior art transistorized logic circuits require coupling elements to connect one circuit to another circuit in order to form a logic chain, thereby creating time delays and complexity of circuitry. Other disadvantages are that prior art transistorized logic circuits normally utilize a plurality of power sources of different voltage levels or a single voltage source having plural voltage outputs of different values. Further, many prior arts logic circuits vary the load on the power supply, thereby causing power noise spikes.

Consequently, it is a further object of this invention to provide new and improved basic transistorized logic circuits having low output impedance and high input impedance.

It is yet another object of this invention to provide new and improved basic transistorized logic circuits which do not require coupling elements to form a logic chain.

It is a still further object of this invention to provide new and improved basic transistorized logic circuits that have a rapid response time and a low-power drain, and draw a relatively constant amount of power from a single output power source.

SUMMARY OF THE INVENTION

In accordance with principles of this invention, transistorized logic or switching circuits having low-power drains and rapid response times are provided. The logic circuits are formed of transistor networks in combination with a series feedback resistor and a tunnel diode. The transistors are coupled together in a feedback manner to enhance rapid switching and assure that a relatively constant current flows from a single level voltage source.

In accordance with other principles of this invention, a low impedance output is provided because the outputs of the basic circuits of the invention are taken across the tunnel diode. In addition, because all input signals are applied to the base of a transistor connected as an emitter follower, the input impedance of the circuits is relatively high. Because the input impedance is high and the output impedance is low, a plurality of transistorized logic circuits formed in accordance with the invention can be connected together to form a logic chain without the requirement for buffers or coupling elements. In other words, because one logic circuit does not excessively load another logic circuit a plurality of them can be directly connected together to form a desired logic chain.

In accordance with a further principle of this invention, the basic logic circuits made in accordance with the invention are AND and NAND gates. From these basic units, all logic functions can be derived. For example, by cross coupling the inputs and outputs of two NAND gates, a bistable multivibrator is formed. Or, by adding suitable delay elements, monostable, and astable multivibrators as well as delay pulse generators are formed. In this regard see "Pulse, Digital and Switching Waveforms," by Jacob Millman and Herbert Taub, 1965, McGraw Hill, particularly page 343.

It will be appreciated from the foregoing brief summary of the invention that new and improved basic logic circuits having rapid response times and low-power drains are provided. The circuits are easily connected together to form any desired logic chain without requiring additional coupling elements, thereby avoiding the inherent problems resulting from the addition of coupling elements. Further, since the invention has constant-current utilization, it provides a relatively constant load on the power supply thereby effectively eliminating power noise spikes. Moreover, as will be better understood from the following description, the invention utilizes a single power supply, whereby the prior art requirement of a complex power supply having outputs at different levels is eliminated.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying drawings wherein.

DESCRIPTION OF THE PREFERRED EMBODIMENTS

Figure 1:
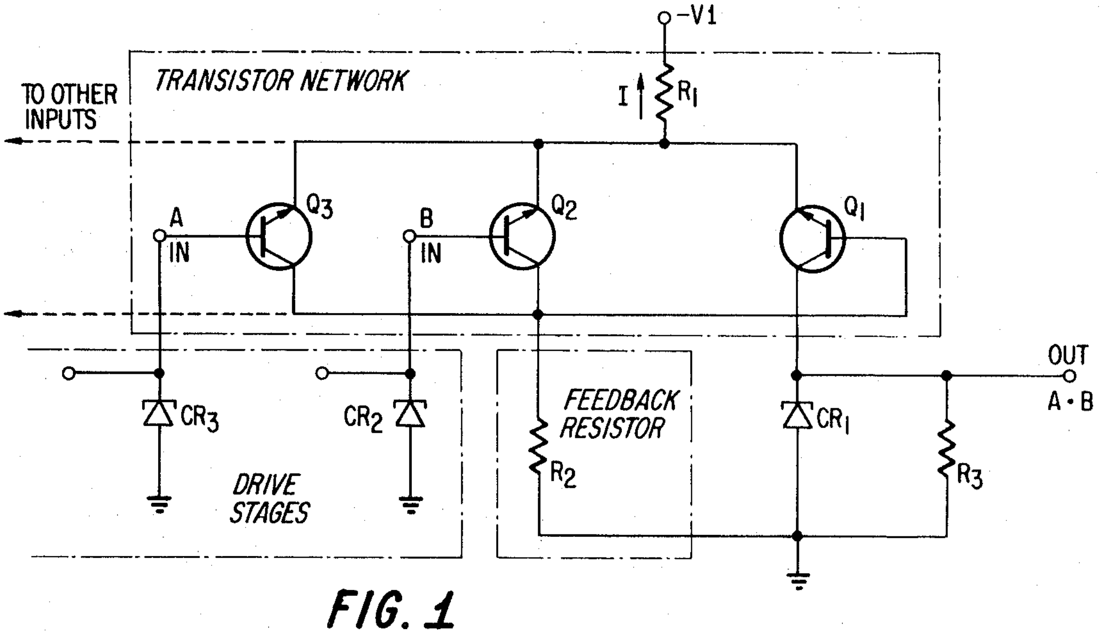
FIG. 1 is a schematic diagram illustrating an AND gate formed in accordance with the invention.

FIG. 1 is an electrical schematic diagram of a basic AND gate formed in accordance with the invention. The AND gate illustrated in FIG. 1 is a two-input AND gate and comprises: three NPN transistors designated $Q_1$, $Q_2$, and $Q_3$ which form a transistor network; three resistors designated $R_1$, $R_2$ and $R_3$; and, a tunnel diode designated $CR_1$. $R_2$ is a series feedback resistor. Also illustrated in FIG. 1 are two tunnel diodes designated $CR_2$ and $CR_3$. $CR_2$ and $CR_3$ are the output tunnel diodes of previous stages of a logic chain or other source of signals.

A single voltage source designated −V1 is connected through $R_1$ to the emitters $Q_1$, $Q_2$ and $Q_3$. The collectors of $Q_2$ and $Q_3$ are connected together and through series feedback resistor $R_2$ to ground. The collector of $Q_1$ is connected to the cathode of $CR_1$ and the anode of $CR_1$ is connected to ground. "Speedup" resistor $R_3$ is connected in parallel with $CR_1$. The cathode of $CR_1$ is connected to an output terminal designated A·B. The base of $Q_1$ is connected to the collectors of $Q_2$ and $Q_3$. The base of $Q_3$ is connected to an input terminal designated A and the base of $Q_2$ is connected to the input terminal designated B.

As illustrated in FIG. 1 input terminal A is connected to the cathode of $CR_2$ and input terminal B is connected to the cathode of $CR_3$. The anodes of $CR_2$ and $CR_3$ are connected to ground. In essence, $CR_2$ and $CR_3$ are the equivalent $CR_1$ in other circuits, i.e., they are the tunnel diodes of other circuits across which the output is taken. Hence, the output signals from other circuits are applied to input terminals A and B, respectively, and the output is taken across $CR_1$ at output terminal A·B.

It will be appreciated by those skilled in the art and others that a tunnel diode has two stable states—a high-voltage state and a low-voltage state. With one or more of the driving tunnel diodes ($CR_2$ or $CR_3$) of the AND gate illustrated in FIG. 1 in the low-voltage state (0.0 volts, for example) its associated input transistor ($Q_2$ or $Q_3$) conducts all of the current I from −V1. The resultant voltage across the internal load of feedback resistor $R_2$ (0.24 volts, for example) is applied to the base of $Q_1$ and cuts off $Q_1$. Thus, no current flows through $CR_1$ with the result that the output voltage is essentially 0.0 volts.

When all of the driving tunnel diodes ($CR_2$ and $CR_3$) are at their high-voltage state (0.5 volts, for example), all input transistors ($Q_2$ and $Q_3$) are cut off. The resultant low-voltage across feedback resistor $R_2$ allows $Q_1$ to conduct all of the current I. The collector current of $Q_1$ now switches $CR_1$ to its high-voltage state, yielding a high-voltage at the output terminal A·B. Thus an output is obtained at A·B or more specifically, the circuit illustrated in FIG. 1 has the characteristics of an AND gate. Preferably, $R_1$, which is the resistor that determines current I, is chosen so that I equals 2 $I_p$, where $I_p$ is the tunnel diode peak current. With reference to a standard tunnel diode characteristic curve, the tunnel diode peak current point is the highest value of current bounded by a negative and positive resistance region. This choice insures rapid switching of the tunnel diode. In one specific embodiment of the invention, $I_p$ was equal to 0.5 milliamperes whereby the power drain of the AND gate was 2.0 milliwatts. This AND gate had a response time of less than 10 nanoseconds.

It will be appreciated by those skilled in the art and others from the foregoing description of FIG. 1 that the basic elements of the invention are transistors and a tunnel diode connected in a novel feedback manner. The invention provides constant-current switching between the two or more transistors as well as feedback between the transistors. In addition, because the output is taken across a tunnel diode, a relatively low output impedance is provided. Moreover, because the input is applied to the base of an emitter follower connected transistor, a relatively high input impedance is created to minimize the load on the output of other circuits. It will also be appreciated that the output of an AND gate of the type illustrated in FIG. 1 may be applied to the input of another similar AND gate without the need for buffers or other coupling elements (such as capacitors, for example).

It will also be appreciated by those skilled in the art and others that, broadly speaking, the circuit illustrated in FIG. 1 is a switching circuit for driving a tunnel diode as a binary storage device. The circuit is responsive to binary signals and controls the distribution of power from a power supply in a desired generally constant manner.

Figure 2:
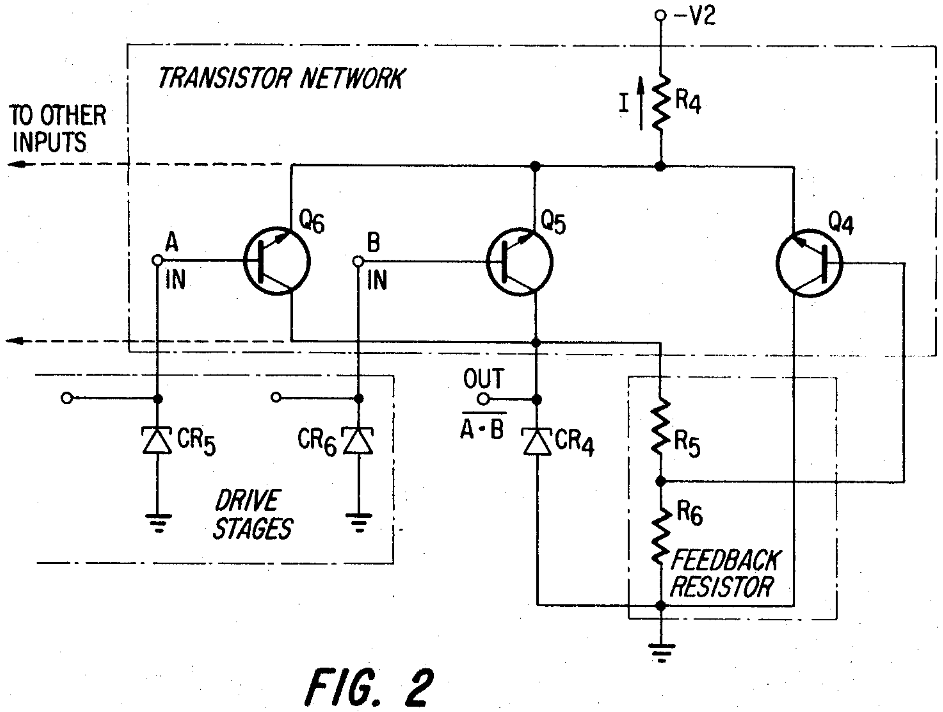
FIG. 2 is a schematic diagram illustrating a NAND gate formed in accordance with the invention.

FIG. 2 is a schematic diagram of a NAND gate formed in accordance with the invention. The circuit illustrated in FIG. 2 comprises: three NPN transistors designated $Q_4$, $Q_5$ and $Q_6$ which form a transistor network; three resistors designated $R_4$, $R_5$ and $R_6$: and, a tunnel diode designated $CR_4$. $R_5$ and $R_6$ form a series feedback resistor circuit. Also illustrated in FIG. 2 are two tunnel diodes designated $CR_5$ and $CR_6$ which form the output of the drive stages in a manner similar to $CR_2$ and $CR_3$ of FIG. 1.

A voltage source designated −V2 is connected through $R_4$ to the emitters of $Q_4$, $Q_5$ and $Q_6$. The collectors of $Q_5$ and $Q_6$ are connected together and through $R_5$ in series with $R_6$ to ground. The collectors of $Q_5$ and $Q_6$ are also connected to the cathode of $CR_4$ and to an output terminal designated $\overline{A \cdot B}$. The anode of $CR_4$ is connected to ground. The collector of $Q_4$ is also connected to ground. The junction between $R_5$ and $R_6$ is connected to the base of $Q_4$. The base of $Q_6$ is connected to an input terminal designated A. Input terminal A is also connected to the cathode of $CR_5$. The anode of $CR_5$ is connected to ground. The base of $Q_5$ is connected to an input terminal designated B. Terminal B is also connected to the cathode of $CR_6$. The anode of $CR_6$ is connected to ground.

A high-voltage output state across $CR_4$ of the NAND gate illustrated in FIG. 2 is obtained whenever all driving tunnel diodes ($CR_5$ and $CR_6$) are not at their high-voltage states. More specifically, when one or more of the driving tunnel diodes ($CR_5$ or $CR_6$) is at its low-voltage state (0.0 volts, for example), the associated input transistor ($Q_5$ or $Q_6$) is conducting current I. This current conduction causes $CR_4$ to be in its high-voltage state (0.5 volts, for example). The voltage at the junction of $R_5$ and $R_6$ (0.25 volts if $R_5$=$R_6$) is applied to the base of $Q_4$ and cuts off $Q_4$. However, when all of the driving tunnel diodes ($CR_5$ and $CR_6$) are in their high-voltage states, none of the input transistors ($Q_5$ or $Q_6$) is conducting and $CR_4$ is in its low-voltage state. The now near zero voltage at the junction of $R_5$ and $R_6$ allows $Q_4$ to conduct all of current I. Thus, this circuit acts as a NAND gate. In one actual embodiment, a NAND gate of the type illustrated in FIG. 2 had a power drain of 2.0 milliwatts and a response time of 10 nanoseconds. Hence, this circuit has both low-power-consumption and rapid response time.

It will be appreciated that in addition to the previously described advantages of the invention, it has certain other advantages. For example, the feedback between the collectors of the input transistors and the base of the output transistor enhances rapid switching and assures that there is a constant current flow (except during switching) in either the output transistor $Q_1$ or $Q_4$ circuit or the input transistors ($Q_2$ and $Q_3$ or $Q_5$ and $Q_6$). Thus, the output tunnel diode has flowing through it either zero current (when the tunnel diode is in its low-voltage state with 0 volts across it) or all the current I (when the tunnel diode is in its high-voltage state with a sufficient amount of voltage across it). Moreover, because very stable tunnel diodes are being used and because of the low impedance and the small driving currents required at the input-output interface, stable operation of these circuits over a wide variation of ambient temperature and power supply voltage is achieved. In addition, it should be noted that the circuit illustrated in FIGS. 1 and 2 use a single power supply which may be relatively low, such as 2.0 volts, for example. It should also be noted that there is a relatively constant load on the power supply (even during switching), thus power noise spikes are effectively eliminated.

It will be appreciated that the circuits illustrated in FIGS. 1 and 2 are basic AND and NAND switching logic circuits. It will also be appreciated that from these circuits all logic functions can be derived. Moreover, a bistable multivibrator may be readily formed by cross coupling the inputs and outputs of two NAND gates. In addition, monostable and astable multivibrators as well as delay pulse generators can be easily obtained by inserting inductance delay elements at 2.0 in the example. It and NAND circuits. Hence, these basic circuits can be utilized in various environments.

It will further be appreciated by those skilled in the art and others that various changes can be made in the above-described embodiments of the invention without departing from the scope of the invention. For example, PNP-transistors can be used instead of NPN-transistors provided suitable voltage source and tunnel diode polarity changes are made. In addition, the invention is not limited to receiving two input signals. Three, four, five or more input signals can be accommodated by adding more input transistors connected in the hereindescribed manner. Hence, this invention can be practiced otherwise than as specifically described.

What is claimed is:

1. A fast response, low-power circuit comprising, a plurality of transistors having emitter, collector and base electrodes; said emitters of said plurality of transistors being connected together at a first terminal, said first terminal being coupled to a first reference voltage source;

a plurality of input terminals adopted to receive logic signals, each said input terminal being connected to a corresponding base electrode of said plurality of transistors;

a resistor connected at a first end to the collectors of said plurality of transistors and at the other end to a second reference potential;

a further transistor, said further transistor having its emitter coupled to said first reference voltage source and its base connected to said first end of said resistor, said further transistor having a collector circuit consisting of;

a parallel tunnel diode-resistor network connected between the collector of said further transistor and said second reference potential, and an output, said output being taken across the tunnel diode.

2. A fast response, low-power-drain circuit as claimed in claim 1 wherein said plurality of transistors and said further transistors are NPN transistors and wherein the cathode of said tunnel diode is connected to the collector of said further transistor and the anode of said tunnel diode is connected to said second reference.

3. A fast response, low-power-drain circuit as claimed in claim 2 wherein the current drawn from said first reference voltage source during circuit operation is equal to twice the tunnel diode peak current.

4. A fast response, low-power-drain circuit as claimed in claim 1 wherein the current drawn from said first reference voltage source during circuit operation is equal to twice the tunnel diode peak current.

5. A fast response, low-power-drain circuit comprising:

a plurality of transistors;

a single level voltage source commonly connected to the emitters of said plurality of transistors;

a plurality of input terminals adapted to receive logic signals, one input terminal being connected to the base of each of said plurality of transistors;

a tunnel diode connected between the collectors of said plurality of transistors and ground;

first and second resistors connected in series, said series connection being connected in parallel with said tunnel diode;

a further transistor having its emitter connected to said single level voltage source and its base connected to the junction between said first and second resistors, the collector of said further transistor being connected to ground; and, an output terminal connected to the junction between the collectors of said plurality of transistors and said tunnel diode.

6. A fast response, low-power-drain circuit as claimed in claim 5 wherein said plurality of transistors and said further transistor are NPN-transistors and wherein the cathode of said tunnel diode is connected to the collectors of said plurality of transistors and the anode of said tunnel diode is connected to ground.

7. A fast response, low-power-drain circuit as claimed in claim 6 including a third resistor connected between the emitters of said plurality of transistor and said further transistor, and said single level voltage source.

8. A fast response, low-power-drain circuit as claimed in claim 7 wherein the current flow from said single level voltage source is equal to twice the tunnel diode peak current.

9. A fast response, low-power-drain circuit as claimed in claim 5 wherein the current flow from said single level voltage source is equal to twice the tunnel diode peak current.

10. In a switching circuit for driving a tunnel diode as a binary storage device in response to binary signals, said switching circuit controlling the distribution of power from a power supply to the tunnel diode, the improvement comprising:

means for maintaining a substantially constant current flow from said power supply irrespective of whether said switching circuit is driving said tunnel diode, said means for maintaining a substantially constant current comprising a resistive feedback means for providing an internal load for said switching circuit when said binary signals do no command the driving of said tunnel diode, said switching circuit further comprises:

means for driving said tunnel diode to its high-voltage state from a completely nonconducting state and for positively cutting off all current in said tunnel diode causing said tunnel diode to reach its low-voltage state, said means for driving said tunnel diode being responsive to the voltage across said resistive feedback means, said high-voltage state of said tunnel diode being characterized by a current in said tunnel diode being characterized by a current in said tunnel diode being substantially equal to twice the tunnel diode peak current.

* * * * *